(12) United States Patent
Yen et al.

(10) Patent No.: US 9,373,434 B2
(45) Date of Patent: Jun. 21, 2016

(54) INDUCTOR ASSEMBLY AND METHOD OF USING SAME

(71) Applicant: Taiwan Semiconductor Manufacturing Co., Ltd., Hsin-Chu (TW)

(72) Inventors: Hsiao-Tsung Yen, Tainan (TW); Shyh-An Chi, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 24 days.

(21) Appl. No.: 13/922,275

(22) Filed: Jun. 20, 2013

(65) Prior Publication Data

US 2014/0375408 A1   Dec. 25, 2014

(51) Int. Cl.
| | |
|---|---|
| *H01F 27/28* | (2006.01) |
| *H01F 5/00* | (2006.01) |
| *H01F 7/06* | (2006.01) |
| *H01F 17/00* | (2006.01) |
| *H01F 21/12* | (2006.01) |

(52) U.S. Cl.
CPC ...... *H01F 17/0013* (2013.01); *H01F 2017/004* (2013.01); *H01F 2021/125* (2013.01); *Y10T 29/4902* (2015.01)

(58) Field of Classification Search
CPC . H01F 17/0006; H01F 17/00; H01F 17/0013; H01F 17/0033; H01F 27/2804; H01F 27/29; H01F 41/122; H01F 41/04; H01F 41/041; H01F 5/003; H01F 2021/125; H01F 2017/004; Y10T 29/4902

USPC .......... 336/200, 223, 222, 182, 220, 142; 29/602.1

See application file for complete search history.

(56) References Cited

U.S. PATENT DOCUMENTS

| | | | |
|---|---|---|---|
| 6,037,649 A * | 3/2000 | Liou | ............................ 257/531 |
| 6,157,285 A | 12/2000 | Tokuda et al. | |
| 6,759,937 B2 | 7/2004 | Kyriazidou | |
| 7,262,680 B2 | 8/2007 | Wang | |
| 7,405,642 B1 * | 7/2008 | Hsu et al. | ...................... 336/200 |
| 7,486,167 B2 | 2/2009 | Loke et al. | |
| 8,508,301 B2 | 8/2013 | Kim et al. | |
| 2002/0101322 A1 | 8/2002 | Liu et al. | |

(Continued)

FOREIGN PATENT DOCUMENTS

| | | |
|---|---|---|
| CN | 1921035 A | 2/2007 |
| CN | 102576657 A | 7/2012 |

(Continued)

OTHER PUBLICATIONS

U.S. Appl. No. 13/760,551, filed Feb. 6, 2013.

(Continued)

*Primary Examiner* — Mangtin Lian
(74) *Attorney, Agent, or Firm* — Duane Morris LLP

(57) ABSTRACT

An inductor assembly generally comprises at least one helical inductive component comprising that includes a plurality of conductive line layers having conductive lines therein. A plurality of vias are configured to couple conductive lines from two or more conductive line layers such that a spacing between two adjacent parallel conductive lines, in different conductive line layers from each other, is two or more times a distance between respective bottom surfaces of two adjacent conductive line layers.

20 Claims, 14 Drawing Sheets

(56) References Cited

U.S. PATENT DOCUMENTS

| | | | |
|---|---|---|---|
| 2009/0295525 A1* | 12/2009 | Okawa | 336/192 |
| 2011/0084765 A1* | 4/2011 | Kim et al. | 330/277 |
| 2011/0090036 A1* | 4/2011 | Kuroda | 336/199 |
| 2011/0291232 A1 | 12/2011 | Yen et al. | |
| 2011/0298551 A1 | 12/2011 | Yen et al. | |
| 2011/0309907 A1* | 12/2011 | Kuroda | 336/222 |
| 2012/0268229 A1 | 10/2012 | Yen et al. | |

FOREIGN PATENT DOCUMENTS

| | | | |
|---|---|---|---|
| JP | 05-283235 A * | 3/1992 | |
| JP | 5283235 A | 10/1993 | |
| JP | 10335143 A | 12/1998 | |
| TW | 200721209 A | 6/2007 | |
| TW | 200919497 A | 5/2009 | |

OTHER PUBLICATIONS

Official Action issued Aug. 26, 2015 in counterpart Taiwan patent application.

Official Action issued May 18, 2015 in counterpart Taiwan patent application.

Official Action issued Mar. 10, 2015 in counterpart Taiwan patent application.

* cited by examiner

INDUCTOR ASSEMBLY AND METHOD OF USING SAME

FIELD

The disclosed assembly and method relate to semiconductor integrated circuits ("ICs") and, more particularly, to an inductor assembly that can be used with ICs.

BACKGROUND

Inductors are passive electrical components that are configured to generate a magnetic field that stores energy. Inductors are used in a wide variety of integrated circuit (IC) applications, such as, for example, voltage regulators and many radio frequency (RF) circuits. At least some known inductors can be built directly on integrated circuits using existing integrated chip fabrication processes.

When designing the inductor, it is important to consider the inductance as well as the quality value or factor (Q factor) of the inductor. The inductance of an integrated inductor is a measure of the amount of energy stored in an inductor. The Q factor is a ratio of the amount of energy stored in an inductor to the amount of energy dissipated in the inductor. An ideal inductor has a relatively high Q factor.

In at least some known inductors, the metal layers are stacked and the distance between the layers can be approximately 0.2 to 1 microns. In order to save, for example, chip area, the metal layers should be relatively close to one another. However, as the distance between the metal layers decreases, the capacitance and resistance substantially increase. Such an increase results in a low resonance frequency which can cause a low Q factor.

DETAILED DESCRIPTION

Figure 1:
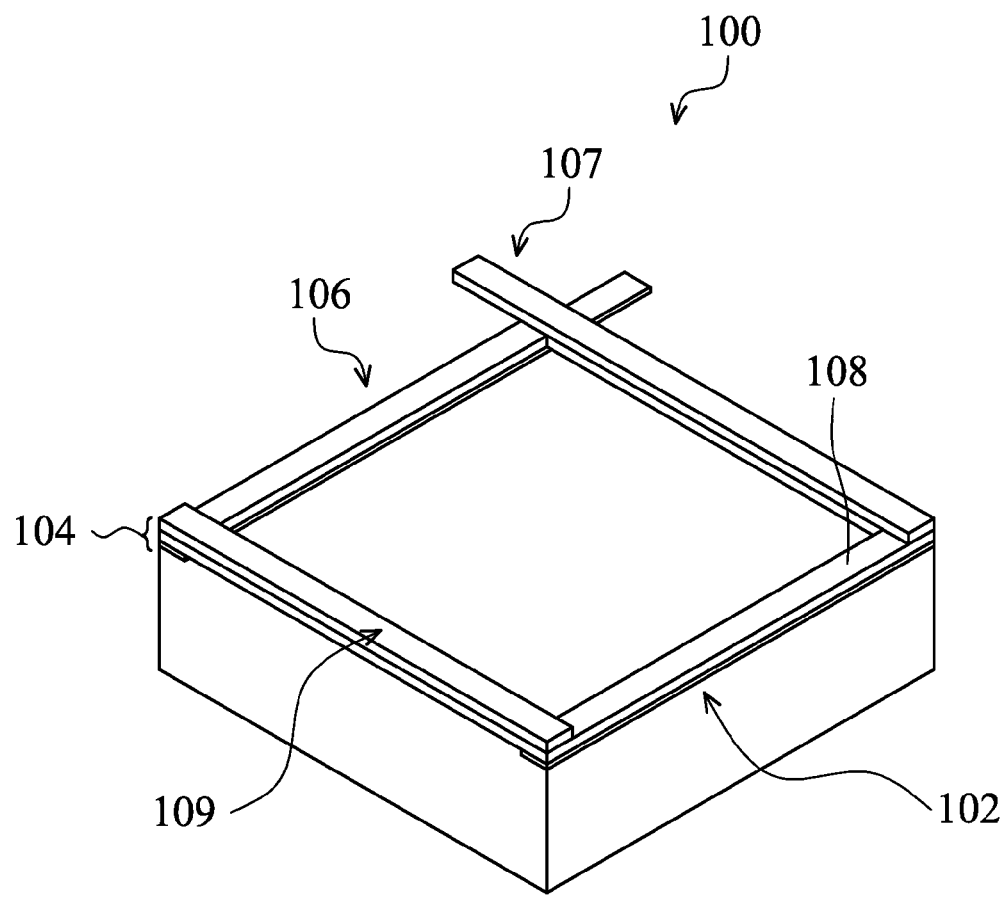
FIG. 1 is an isometric view of an exemplary semiconductor module.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus, assembly, and/or system be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This description of the exemplary embodiments is intended to be read in connection with the accompanying drawings, which are to be considered part of the entire written description. The drawings are not drawn to scale. In the various drawings, like reference numerals indicate like items, unless expressly indicated otherwise in the text.

The term "metal layers" as used herein collectively refers to conductive line layers, which can comprise metal conductive lines (e.g., copper) or a non-metal conductive lines (e.g., polycrystalline silicon lines).

Embodiments of the exemplary assembly and method described herein overcome at least some disadvantages of inductors by providing an inductor assembly that includes at least one helical inductive component that is configured to facilitate tuning capacitance and resistance therein, while also saving chip area. More specifically, the inductor assembly includes a plurality of conductive line layers having conductive lines therein and a plurality of vias that are configured to couple the conductive lines to direct a current flow therein. For example, in one embodiment, adjacent parallel conductive lines of the inductor are spaced apart from each other by a distance corresponding to two or more conductive line layers, skipping at least one of the conductive line layers. In another embodiment, the vias are coupled to the layers such that conductive lines in two or more layers are shunted to redirect the current flow from one of the layers to a different layer. When the vias are coupled to the conductive line layers such that two adjacent parallel conductive lines of the inductor are spaced further apart and/or shunted, the capacitance and the resistance of the inductor assembly substantially decreases without having to space the metal layers substantially apart from each other. Such a decrease results in a relatively higher resonance frequency which can cause a substantially higher quality factor (Q factor) of the inductor assembly while also saving chip space.

FIG. 1 is an isometric view of a semiconductor module 100 that includes a substrate 102, which can be a semiconductor substrate, such as a silicon substrate or another dielectric substrate. In some embodiments, the substrate can be, germanium, a compound semiconductor, or an semiconductor-on-insulator (SOI) substrate. A compound semiconductor can be an III-V semiconductor compound such as gallium arsenide (GaAs). An SOI substrate can comprise a semiconductor on an insulator such as glass. In some embodiments, substrate 102 can be a package substrate, such as a printed circuit board or an organic board that is connected to at least one other substrate (not shown). Semiconductor module 100 also includes an inductor assembly 104 that is formed onto substrate 102.

Inductor assembly 104 includes at least one helical inductive component 106 that is configured to facilitate tuning capacitance and resistance within inductor assembly 104 by directing current flow therein. More specifically, as explained in more detail below, helical inductive component includes a plurality of conductive line layers 108 that are coupled to each other with a plurality of vias ((vias, described below with reference to FIGS. 2-7) in various configurations. Inductor assembly 104 also includes ports 107 and 109. A current (not shown) injected into port 107 thus can flow to port 109, and vice versa. For example, the current injected into port 107 can flow through metal layers 108 to port 109. The configurations of metal layers 108 and the vias enable the current flow traveling through the metal layers 108 to cause smaller parasitic capacitance. Such a decrease results in a relatively high resonance frequency which can cause a substantially high Q factor of inductor assembly 104.

Figure 2A:
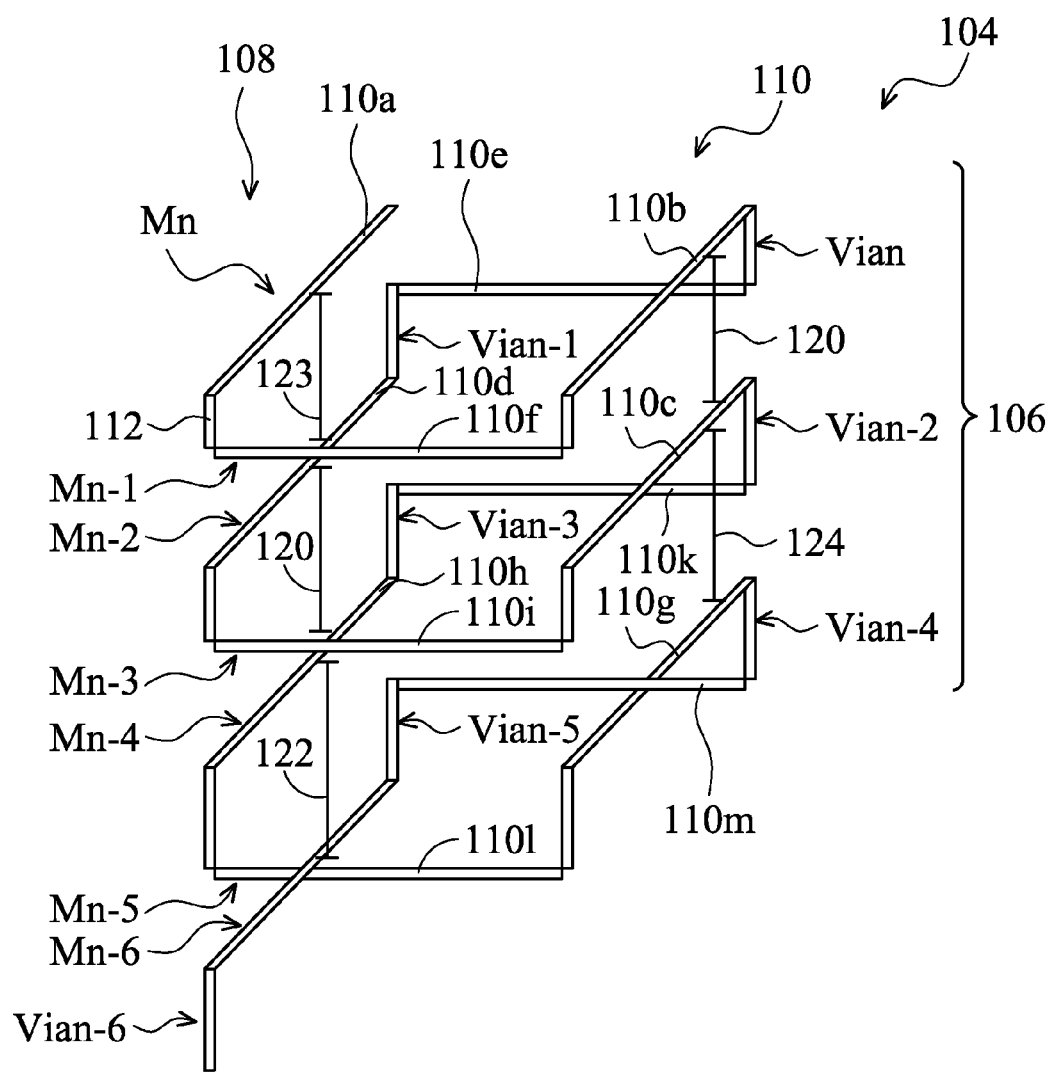
FIGS. 2A and 2B include an exemplary inductor assembly that is used with the semiconductor module shown in FIG. 1.
Figure 2B:
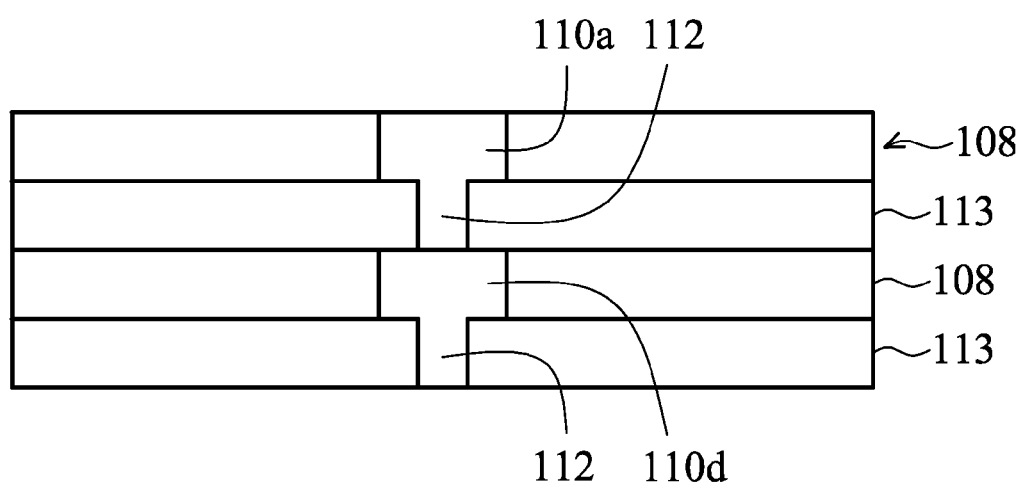

FIG. 2A illustrates inductor assembly 104. In some embodiments, inductor assembly 104 includes one helical inductive component 106 that includes portions formed of conductive layers 108, such as metal layers, that are stacked on top of each other. For example, as shown in FIG. 2B, metal layers 108 are stacked such that via layers 113 are positioned adjacent to each of the metal layers 108. As such, metal layers 108 are not directly adjacent to each other. Moreover, metal layers 108 each include metal lines 110, such as lines 110*a* and 110*c*, wherein vias 112 are positioned adjacent to each of the metal lines 110*a* and 110*c*. Referring to FIG. 2A, metal layers 108 are stacked in rows that are shown as $M_{n-6}$ (bottom metal layer) through $M_n$ (top metal layer), wherein each metal layer 108 includes at least one conductive line (e.g., metal line), such as lines 110*a* and 110*f*. The conductive lines can be copper lines formed by a single damascene or dual damascene process. In some embodiments, when metal layer 108 includes two metal lines, such as lines 110*a* and 110*b*, the two metal lines 110*a* and 110*b* are parallel with respect to each other.

Inductive component 106 includes vias 112 that are shown as $Via_{n-6}$ through $Via_n$, and each of the vias 112 are configured to couple two metal layers 108. In some embodiments, vias 112 are coupled between metal layers 108 such that adjacent parallel conductive line portions, such as 110*a* and 110*d*, of the inductive component 106 are separated from each other by a distance corresponding to two conductive line layers 108, skipping one of the conductive line layers 108. (This total distance includes the combined thickness of two conductive line layers plus two via layers). Thus, current flow (not shown) through metal layers 108 is directed to skip a second metal layer 108 that is positioned between a first and a third metal layer 108 and produce lower parasitic capacitance which exist between metal lines. For example, three of the $Via_n$ are positioned between the lines 110*a* and 110*b* of layer $M_n$ and the lines 110*e* and 110*f* of layer $M_{n-1}$. Each of the vias 112 are coupled to the respective lines of the metal layers 108 such that each connector 112 is perpendicular to the respective line.

While each of the vias 112 are coupled to metal lines, such as line 110*a*, each of the lines of layer $M_{n-1}$ is positioned a distance 120 from the respective parallel lines of layer $M_{n-3}$, and each of the lines of layer $M_{n-3}$ is positioned a distance 122 from the respective parallel lines of layer $M_{n-5}$, wherein distance 120 can be equal or not equal to distance 122. Similarly, the lines of layer $M_n$ is positioned a distance 123 from the respective parallel lines of layer Mn−2, and the lines of layer Mn−2 is positioned a distance 124 from the respective parallel lines of layer Mn−4, wherein distance 123 can be equal or not equal to distance 124. In general, adjacent parallel conductive lines, such as line 110*a* and 110*d*, of the inductive component 106 are separated from each other by a distance corresponding to two conductive line layer 108, skipping one of the conductive line layers 108.

With the adjacent parallel conductive lines of the inductor separated by at least two times a distance between two adjacent metal layers, parasitic capacitance and resistance of inductor assembly 104 substantially decreases without having to space the metal layers 108 further apart from each other, as explained in more detail below with respect to FIG. 8A. Such a decrease results in a relatively high resonance frequency which can cause a substantially higher quality factor (Q factor) of inductor assembly 104 while also saving chip space, as explained in more detail below with respect to FIG. 8B.

Although the example of FIG. 2 shows adjacent parallel conductive lines of the inductive component 106 separated by two times a distance between two adjacent metal layers, in other embodiments, adjacent parallel conductive line of the inductive component can be separated by three, four or more times a distance between two adjacent metal layers. That is, the minimum spacing between two adjacent parallel conductive lines can be N* (the sum of the thickness of a conductive line layer+the thickness of a via layer), where N is any integer greater than one.

Figure 3:
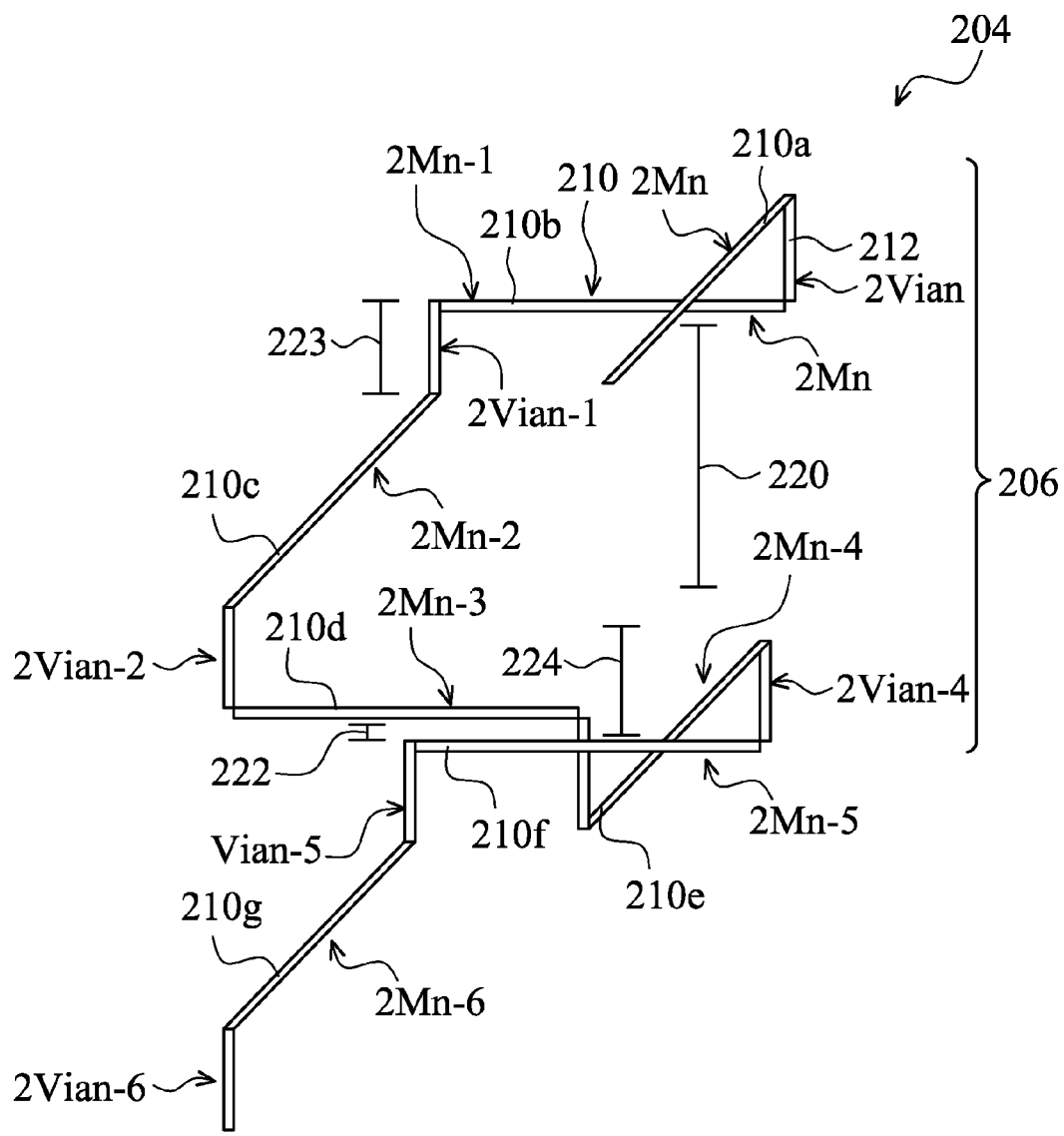
FIG. 3 is a partially exploded view of an alternative inductor assembly that is used with the semiconductor module shown in FIG. 1.

FIG. 3 illustrates an embodiment of an inductor assembly 204 that can be used with semiconductor module 100 (shown in FIG. 1) in place of inductor assembly 104 (shown in FIGS. 1 and 2). In some embodiments, inductor assembly 204 includes one helical inductive component 206 that includes portions formed of conductive line layers, such as metal layers 208, that are stacked on top of each other. More specifically, metal layers 208 are stacked in rows that are shown as $2M_n$ (top metal layer) through $2M_{n-6}$ (bottom metal layer), wherein each metal layer 208 includes a conductive line or line segment 210, such as metal line 210*a*. Moreover, layers $2M_n$, $2M_{n-2}$, $2M_{n-4}$, and $2M_{n-6}$ are parallel with respect to each other, while layers $2M_{n-1}$, $2M_{n-3}$, and $2M_{n-5}$ are parallel with respect to each other.

Inductive component 206 includes a plurality of vias or vias 212 that are shown as $2Via_n$ through $2Via_{n-6}$, and vias 212 are configured to couple metal layers 208. In some embodiments, vias 212 are coupled between metal layers 208 such that adjacent parallel conductive lines, such as 210*a* and 210*c*, of inductive component 206 are separated from each other by a distance corresponding to four conductive line layers 208, skipping two of the conductive line layers 208 (this total distance includes the combined thickness of four conductive line layers plus four via layers). Thus, current flow (not shown) through metal layers 208 is directed to skip a second and a third metal layer 208 that are positioned between a first and fourth metal layer 208. More specifically, for example, $2Via_n$ is positioned between adjacent layers $2M_n$ and $2M_{n-1}$, $2Via_{n-1}$ is positioned between adjacent layers $2M_{n-1}$ and $2M_{n-2}$, $2Via_{n-2}$ is positioned between adjacent layers $2M_{n-2}$ and $2M_{n-3}$, $2Via_{n-3}$ is positioned between adjacent layers $2M_{n-3}$ and $2M_{n-4}$, $2Via_{n-4}$ is positioned between adjacent layers $2M_{n-4}$ and $2M_{n-5}$, and $2Via_{n-5}$ is positioned between adjacent layers $2M_{n-5}$ and $2M_{n-6}$. In some embodiments, each of the vias 212 are coupled to the lines in each of the respective metal layers 208 such that each connector 212 is perpendicular to each line.

While each of the vias 212 are coupled to metal lines, such as line 210 and line 210*b*, line 210*b* of layer $2M_{n-1}$ is positioned a distance 220 from the respective parallel line 210*d* of layer $2M_{n-3}$, and line 110 of layer $2M_{n-3}$ is positioned a distance 222 from the respective parallel line 210*f* of layer $2M_{n-5}$, wherein distance 220 can be equal or not equal to distance 222. Similarly, the line 210*a* of layer $2M_n$ is positioned a distance 223 from the respective parallel line 210*c* of layer $2M_{n-2}$, and the line 210*c* of layer $2M_{n-2}$ is positioned a distance 124 from the respective parallel line 210*e* of layer $2M_{n-4}$, wherein distance 223 can be equal or not equal to distance 224

With adjacent parallel conductive lines of the inductor separated by three times a distance between two metal layers 208, parasitic capacitance and resistance of inductor assembly 204 substantially decreases without having to space the metal layers 208 further apart from each other. Such a decrease results in a relatively high resonance frequency which can cause a substantially higher quality factor (Q factor) of inductor assembly 204 while also saving chip space.

Figure 4A:
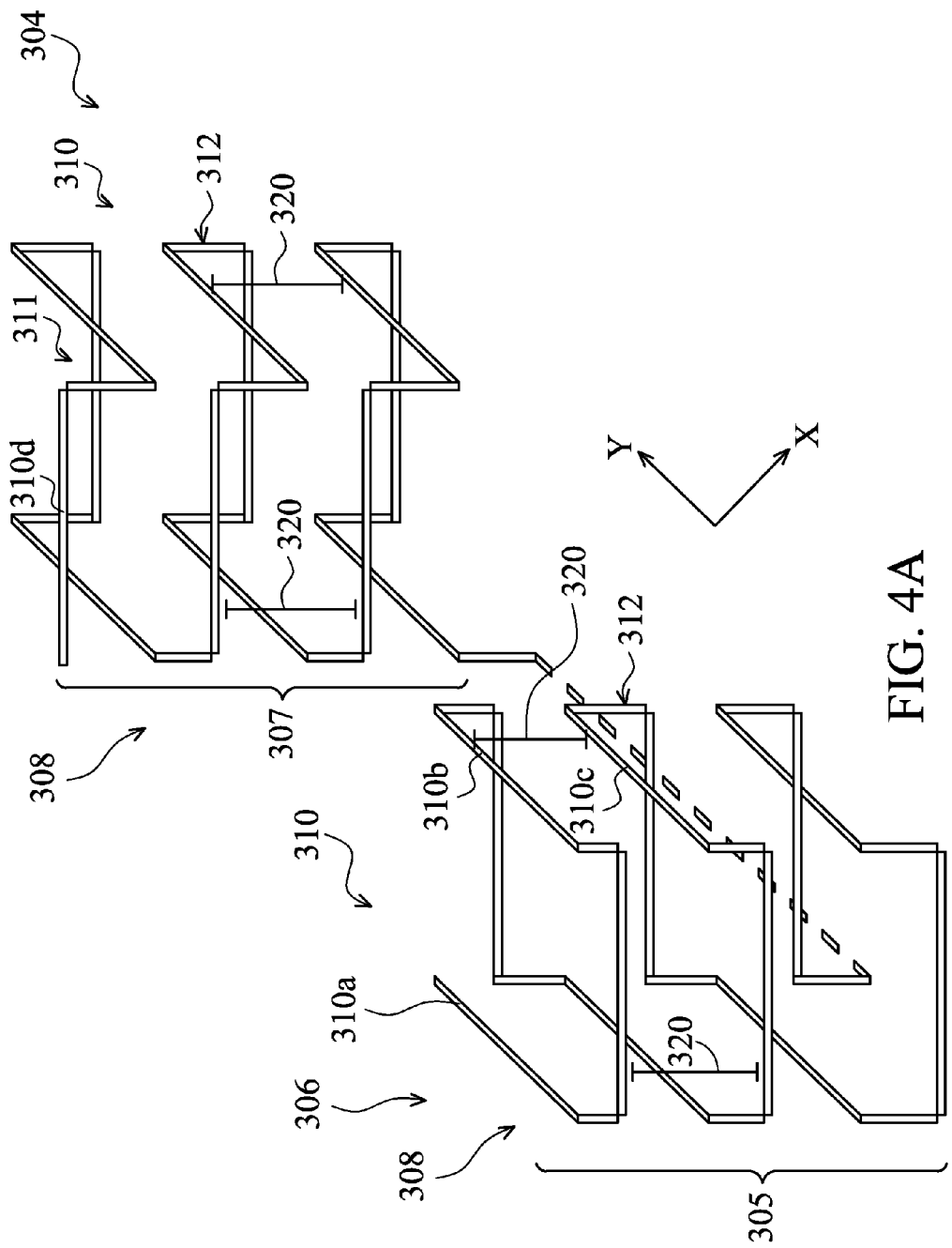
FIGS. 4A-4D include partially exploded views of other alternative inductor assemblies that are used with the semiconductor module shown in FIG. 1.
Figure 4B:
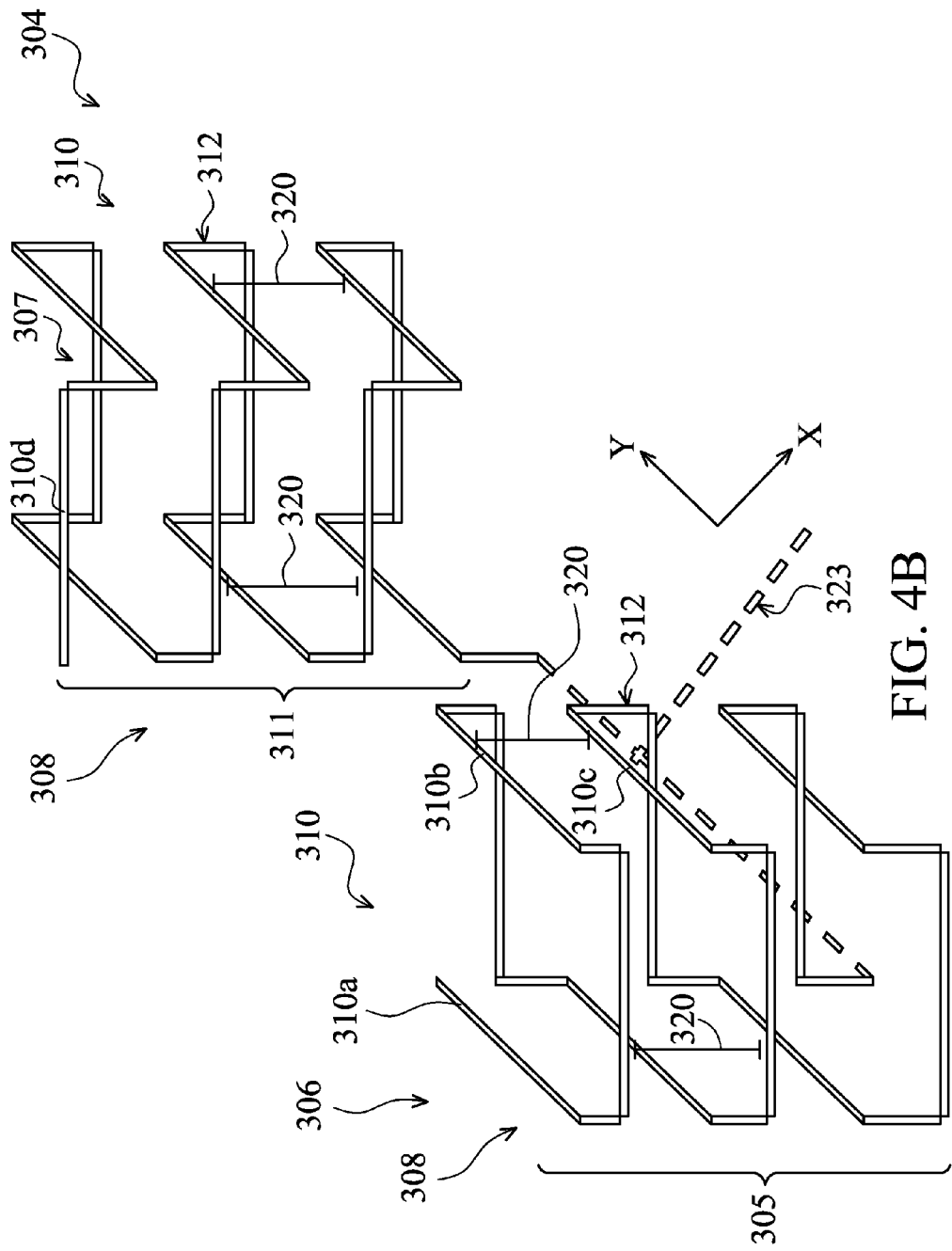

FIGS. 4A and 4B include embodiments of an inductor assembly 304 that can be used with semiconductor module 100 (shown in FIG. 1) in place of inductor assembly 104 (shown in FIGS. 1 and 2). Inductor assembly 304 includes a first helical inductive component 306 and a second helical inductive component 307 coupled to component 306 such as, for example, in series. Each of the inductive components 306 and 307 include portions formed of conductive line layers, such as metal layers 308, that are stacked on top of each other. Each metal layer 308 includes at least one conductive line 310, such as metal line 310a. When two metals lines exist for the metal layer 308, the two metal lines are parallel with respect to each other, such as lines 310a and 310b.

Each inductive component 306 and 307 includes a plurality of vias 312. Vias 312 are configured to couple metal layers 308 in each inductive component 306 and 307 such that inductive component 306 is arranged to have a first layout 305 and inductive component 307 is arranged to have a second layout 311, wherein first layout 305 is different with respect to second layout 311. For example, the top metal layer 308 for inductive component 306 has two lines 310a and 310b that are parallel with respect to each other. In contrast, the top layer for inductive component 307 includes only one line 310d that is coupled to one of lines of an adjacent metal layer 308 with one connector 312.

Although first layout 305 is different with respect to second layout 311, each of the vias 312 are coupled between metal layers 308 in each inductive component 306 and 307 such that adjacent parallel conductive lines, such as 310b and 310c, are separated from each other by a distance corresponding to two conductive line layers 308, skipping one of the conductive line layers 308 (this total distance includes the combined thickness of two conductive line layers plus two via layers). Thus, current flow (not shown) through metal layers 308 is directed to skip a second metal layer 308 that is positioned between a first and a third metal layer 308. When each of the vias 312 are coupled to metal layers 308 in each inductive component 306 and 307, each of the lines 310 that are parallel with respect to each other, such as lines 310b and 310c, are positioned a distance 320 from each other. A center tap 323 (shown in FIG. 4B) can facilitate application of a bias voltage between each inductive component 306 and 307. Although only two inductive components are illustrated in FIGS. 4A and 4B, inductor assembly 304 can include any number of inductive components, wherein the inductive components can include layouts that can be different or identical with respect to each other.

Figure 4C:
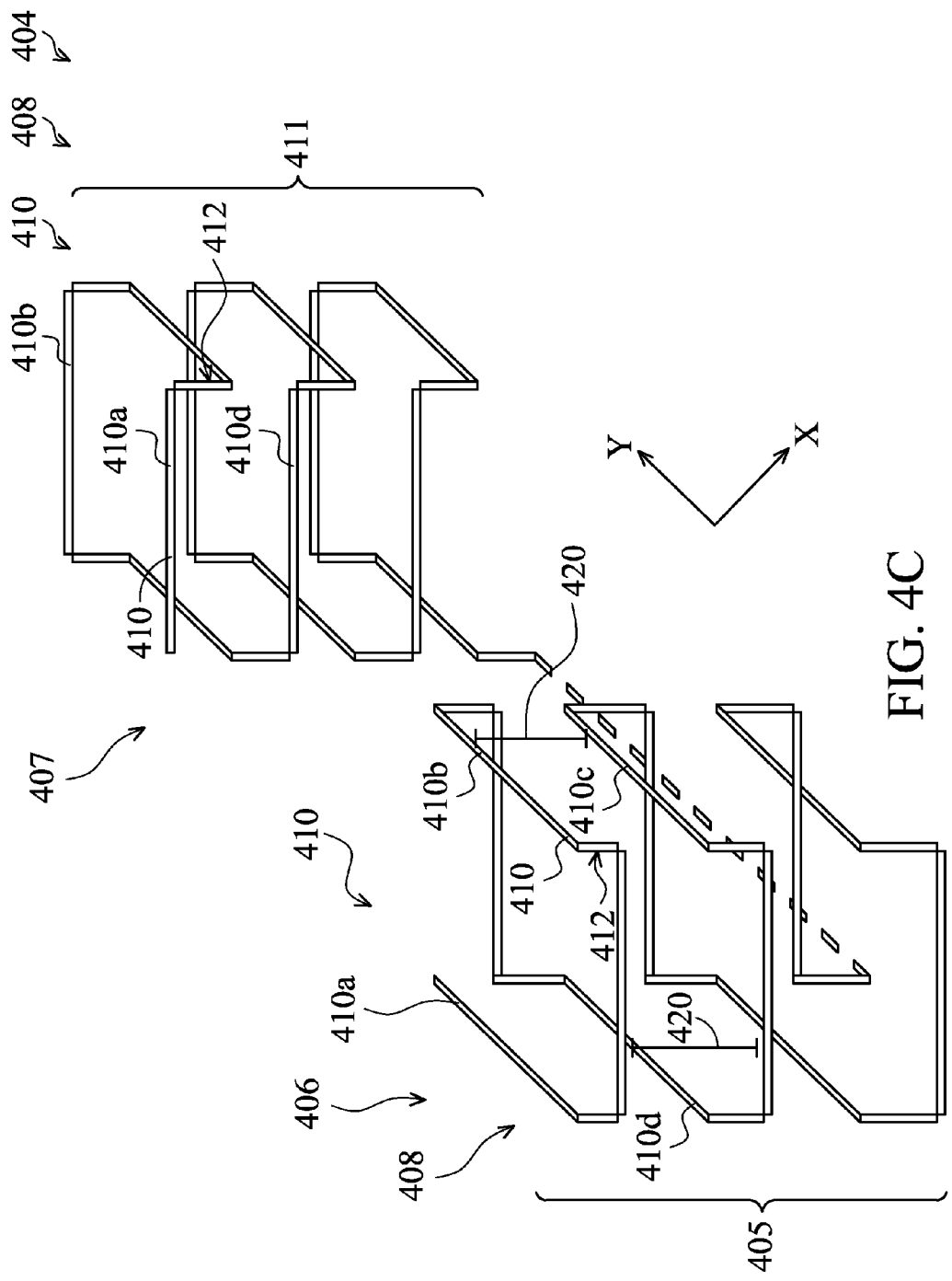
Figure 4D:
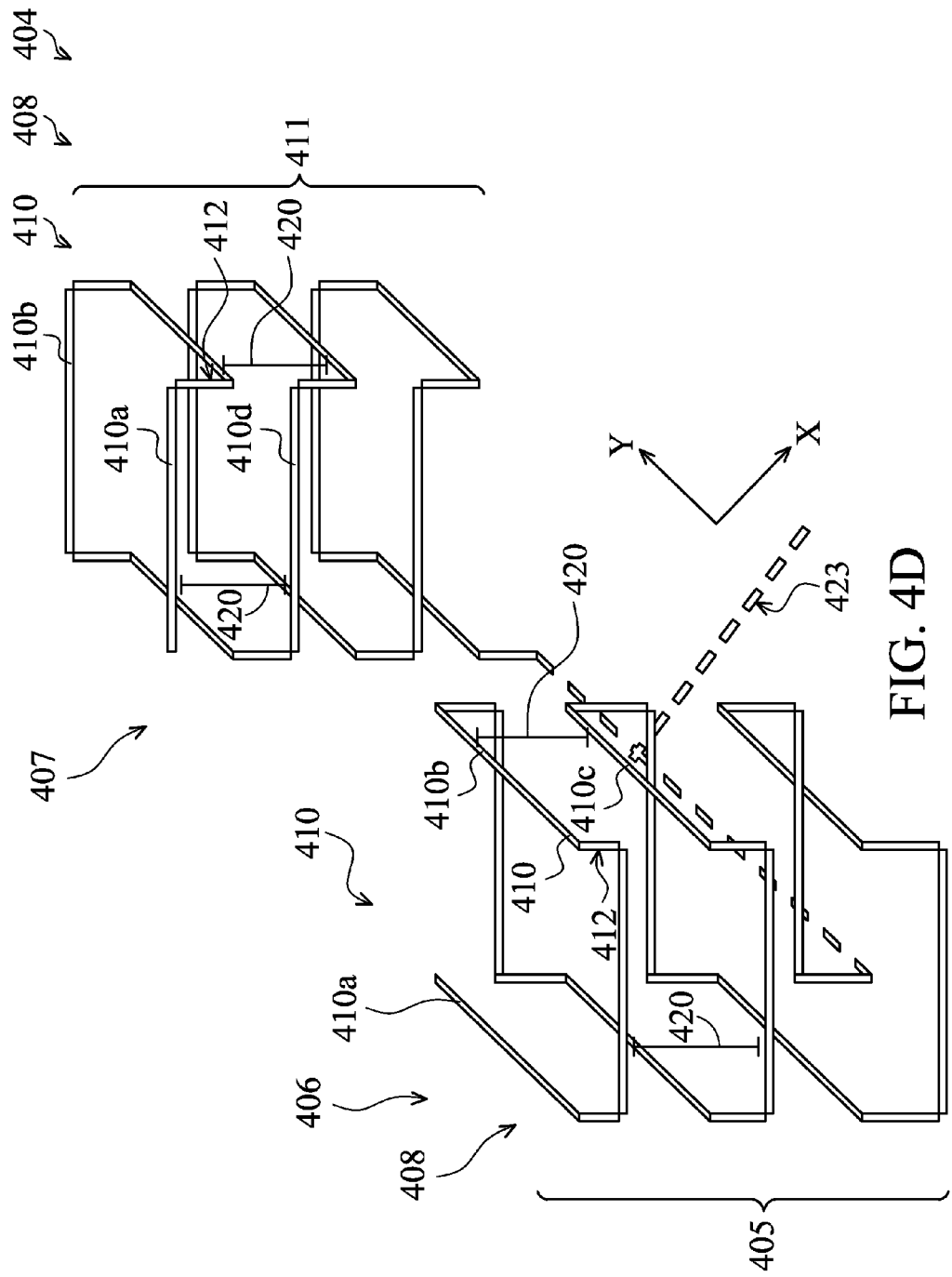

FIGS. 4C and 4D include embodiments of an inductor assembly 404 that can be used with semiconductor module 100 (shown in FIG. 1) in place of inductor assembly 104 (shown in FIGS. 1 and 2). Inductor assembly 404 includes a first helical inductive component 406 and a second helical inductive component 407 coupled to component 406 such as, for example, in series. Each of the inductive components 406 and 407 include portions formed of conductive line layers, such as metal layers 408, that are stacked on top of each other. More specifically, for each of the inductive components 406 and 407, metal layers 408 are stacked in rows. Each metal layer 408 includes two conductive lines 410, such as metal lines 410a and 410b, wherein each of the two metals lines for each metal layer 408 are parallel with respect to each other.

Each inductive component 406 and 407 includes a plurality of vias or vias 412 that are configured to couple metal layers 408 in each inductive component 406 and 407 such that inductive component 406 is arranged to have a first layout 405 and inductive component 407 is arranged to have a second layout 411, wherein first layout 405 is identical with respect to second layout 411. Although first layout 405 is identical with respect to second layout 411, one layout can be rotated in a different direction with respect to the other layout. For example, second layout 411 can be rotated to the left with respect to the y-axis by approximately 90 degrees. In some embodiments, the layouts can be identical with no rotation by either one of the layouts.

Each of the vias 412 are coupled between metal layers 408 in each inductive component 406 and 407 such that adjacent parallel conductive lines, such as 410b and 410c, are separated from each other by a distance corresponding to two conductive line layers 408, skipping one of the conductive line layers 408 (this total distance includes the combined thickness of two conductive line layers plus two via layers). Thus, current flow (not shown) through metal layers 408 is directed to skip a second metal layer 408 that is positioned between a first and a third metal layer 408. When each of the vias 412 are coupled to metal layers 408 in each inductive component 406 and 407, each of the lines that are parallel with respect to each other, such as lines 410b and 410c, are positioned a distance 420 from each other. A center tap 423 (shown in FIG. 4D) can facilitate application of a bias voltage between each inductive component 406 and 407. Although only two inductive components are illustrated in FIGS. 4C and 4D, inductor assembly 404 can include any number of inductive components that include any number of metal layers and inductors. Each of the inductive components can include layouts that can be different or identical with respect to each other.

Figure 5A:
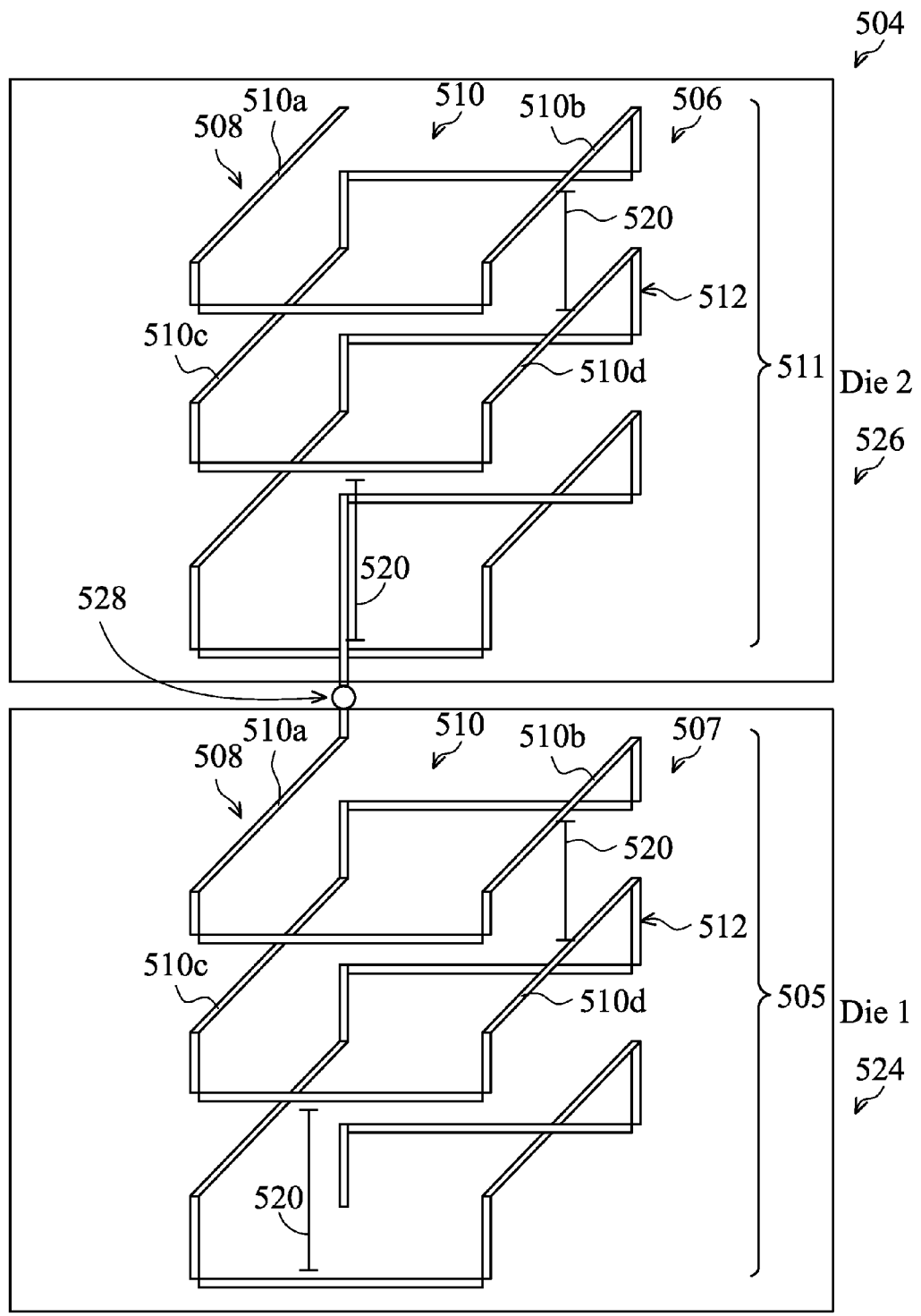
FIGS. 5A and 5B include another alternative inductor assembly that is used with the semiconductor module shown in FIG. 1.
Figure 5B:
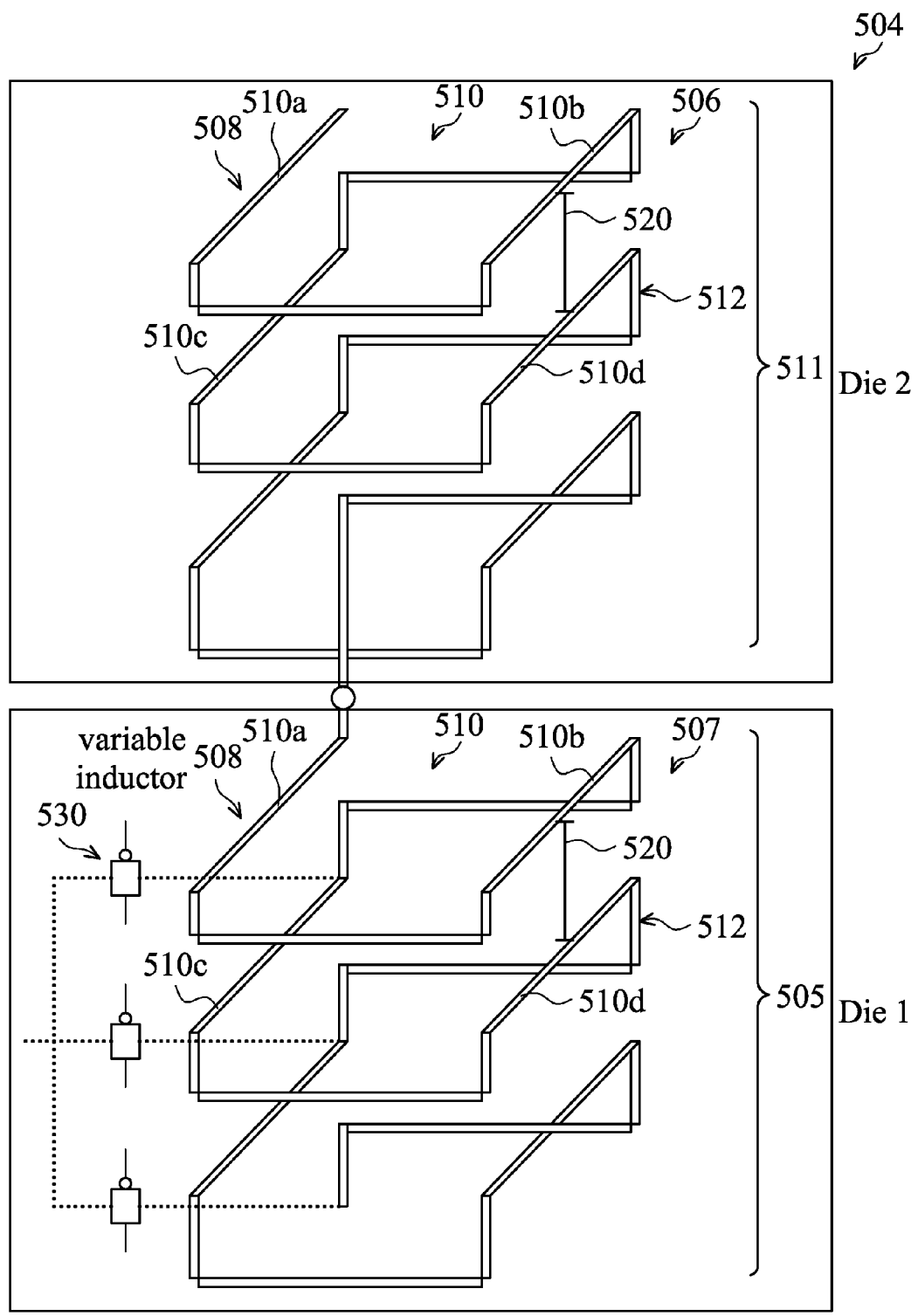

FIGS. 5A and 5B include embodiments of an inductor assembly 504 that can be used with semiconductor module 100 (shown in FIG. 1) in place of inductor assembly 104 (shown in FIGS. 1 and 2). Inductor assembly 504 includes a first helical inductive component 506 and a second helical inductive component 507, wherein each of the inductive components 506 and 507 include portions formed of conductive line layers, such as metal layers 508, that are stacked on top of each other. More specifically, for each of the inductive components 506 and 507, metal layers 508 are stacked in rows. Each metal layer 508 includes two conductive lines 510, such as metal lines 510a and 510b, wherein each of the two metals lines for each metal layer 508 are parallel with respect to each other.

Each Inductive component 506 and 507 includes a plurality of vias 512. Vias 512 are configured to couple metal layers 508 in each inductive component 506 and 507 such that inductive component 506 is arranged to have a first layout 505 and inductive component 507 is arranged to have a second layout 511, wherein first layout 505 is identical with respect to second layout 511. In some embodiments, the layouts can be identical, but one of the layouts can be rotated with respect to the other. In other embodiments, the layouts can be different with respect to each other.

Each of the vias 512 are coupled between metal layers 508 in each inductive component 506 and 507 such that adjacent parallel conductive lines, such as 510a and 510c, are separated from each other by a distance corresponding to two conductive line layers 508, skipping one of the conductive line layers 508 (this total distance includes the combined thickness of two conductive line layers plus two via layers). Thus, current flow (not shown) through metal layers 508 is directed to skip a second metal layer 508 that is positioned between a first and a third metal layer 508. When each of the vias 512 are coupled to metal layers 508 in each inductive component 506 and 507, each of the lines that are parallel with respect to each other, such as lines 510b and 510d, are positioned a distance 520 from each other.

Moreover, in some embodiments, at least a portion of first inductive component 506 is disposed onto a first integrated chip (IC) die 524 and at least a portion of second inductive component 507 is disposed onto a second IC die 526 that is vertically stacked onto the first IC die 524. A conductive connecting element 528, such as a micro-bump or a copper pillar, can be positioned between first IC die 524 and second IC die 526, wherein conductive connecting element 528 electrically connects first inductive component 506 in series with second inductive component 507. At least one switch 530 (shown in FIG. 5B) can be coupled to at least one of the inductive components, such as first inductive component 506. Switch 530 is configured to vary the current flow and/or inductance within assembly 504.

Figure 6A:
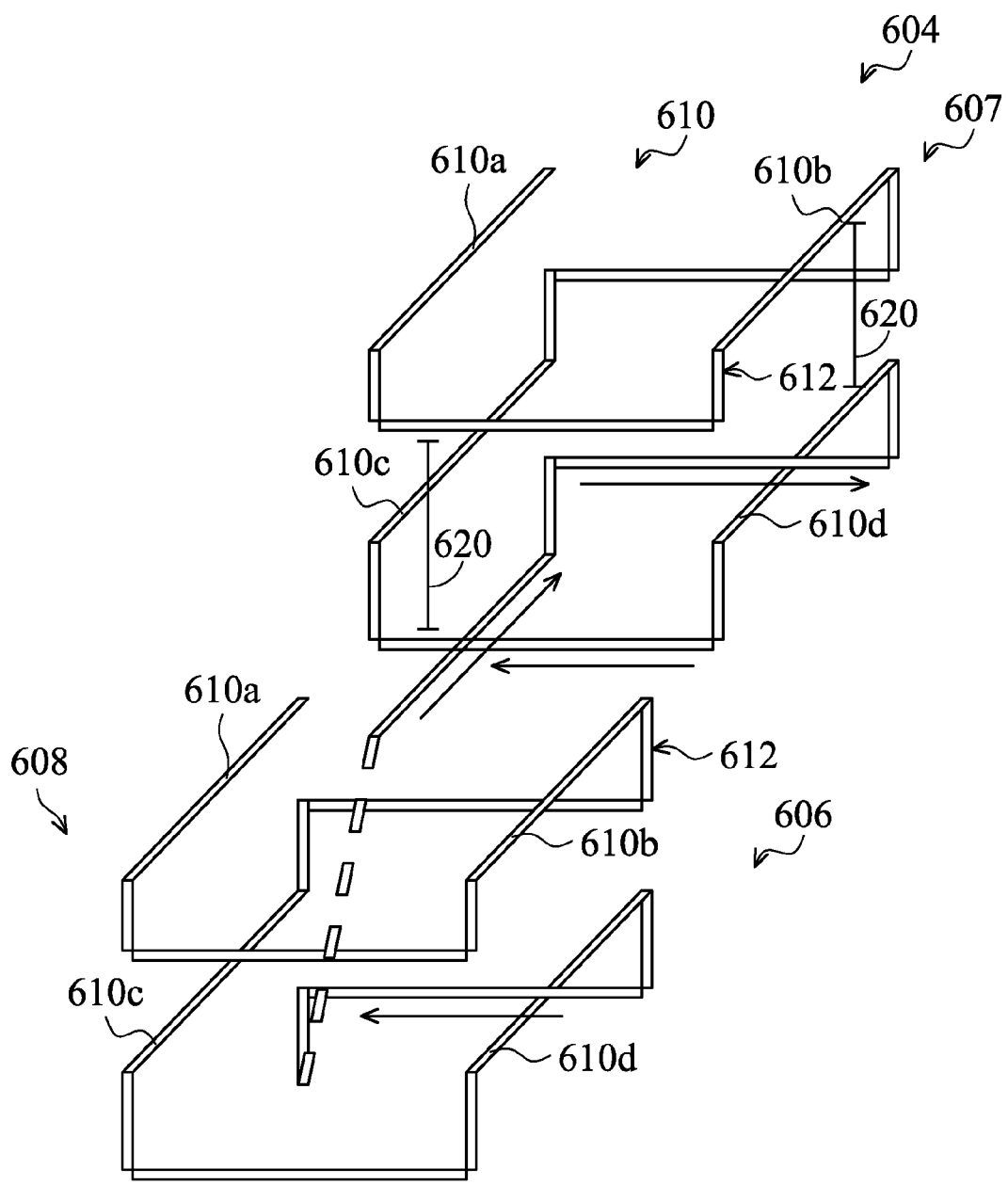
FIGS. 6A and 6B include partially exploded views of other alternative inductor assemblies used with the semiconductor module shown in FIG. 1.

FIGS. 6A includes an embodiment of an inductor assembly 604 that can be used with semiconductor module 100 (shown in FIG. 1) in place of inductor assembly 104 (shown in FIGS. 1 and 2). Inductor assembly 604 includes a first helical inductive component 606 and a second helical inductive component 607 such that components 606 and 607 are coupled in series. Each of the inductive components 606 and 607 include portions formed of conductive line layers, such as metal layers 608, that are stacked on top of each other. More specifically, for each of the inductive components 606 and 607, metal layers 608 are stacked in rows. Each metal layer 608 includes two conductive lines 610, such as metal lines 610a and 610b, wherein each of the two metals lines for each metal layer 608 are parallel with respect to each other.

Each inductive component 606 and 607 includes a plurality of vias 612 that are configured to couple metal layers 608 in each inductive component 606 and 607 such that inductive component 606 is arranged to have a first layout 605 and inductive component 607 is arranged to have a second layout 611, wherein first layout 605 is identical with respect to second layout 611. Although first layout 405 is identical with respect to second layout 411, one layout can be rotated to a different direction. In some embodiments, the layouts can be different.

Each of the vias 612 are coupled between metal layers 608 in each inductive component 606 and 607 such that adjacent parallel conductive lines, such as 610a and 610c, are separated from each other by a distance corresponding to two conductive line layers 608, skipping one of the conductive line layers 608 (this total distance includes the combined thickness of two conductive line layers plus two via layers). Thus, current flow (not shown) through metal layers 608 is directed to skip a second metal layer 608 that is positioned between a first and a third metal layer 608. When each of the vias 612 are coupled to metal layers 608 in each inductive component 606 and 607, each of the lines that are parallel with respect to each other, such as lines 610b and 610d, are positioned a distance 520 from each other.

Figure 6B:
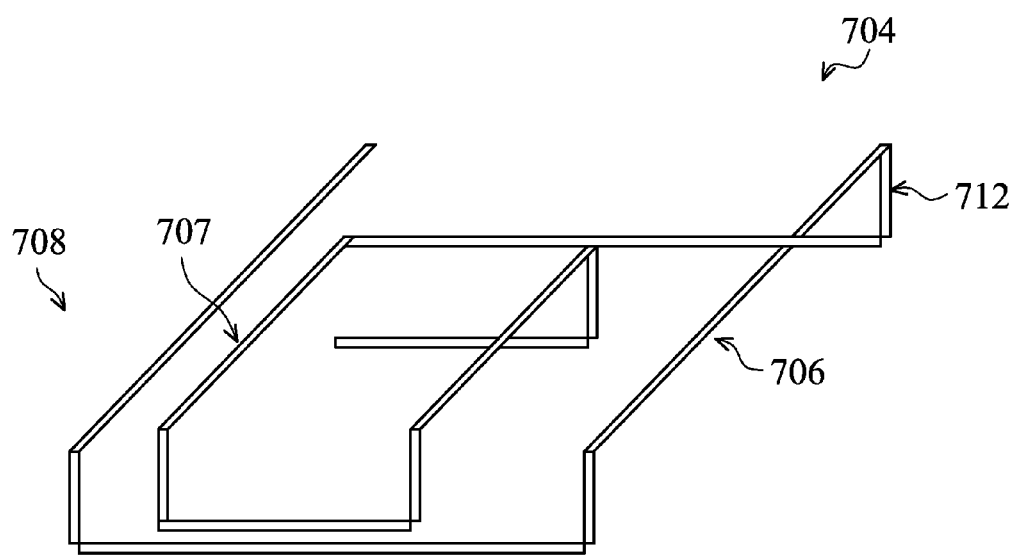

FIG. 6B includes an embodiment of an inductor assembly 704 that can be used with semiconductor module 100 (shown in FIG. 1) in place of inductor assembly 104 (shown in FIGS. 1 and 2). Inductor assembly 704 includes a first helical inductive component 706 and a second helical inductive component 707, wherein first inductive component 706 substantially surrounds second inductive component 707. Each of the inductive components 706 and 707 include portions formed of conductive line layers, such as metal layers 708, that are stacked on top of each other. Each inductive component 706 and 707 also includes a plurality of vias 712 that are configured to couple metal layers 708 in each inductive component 706 and 707.

Figure 7:
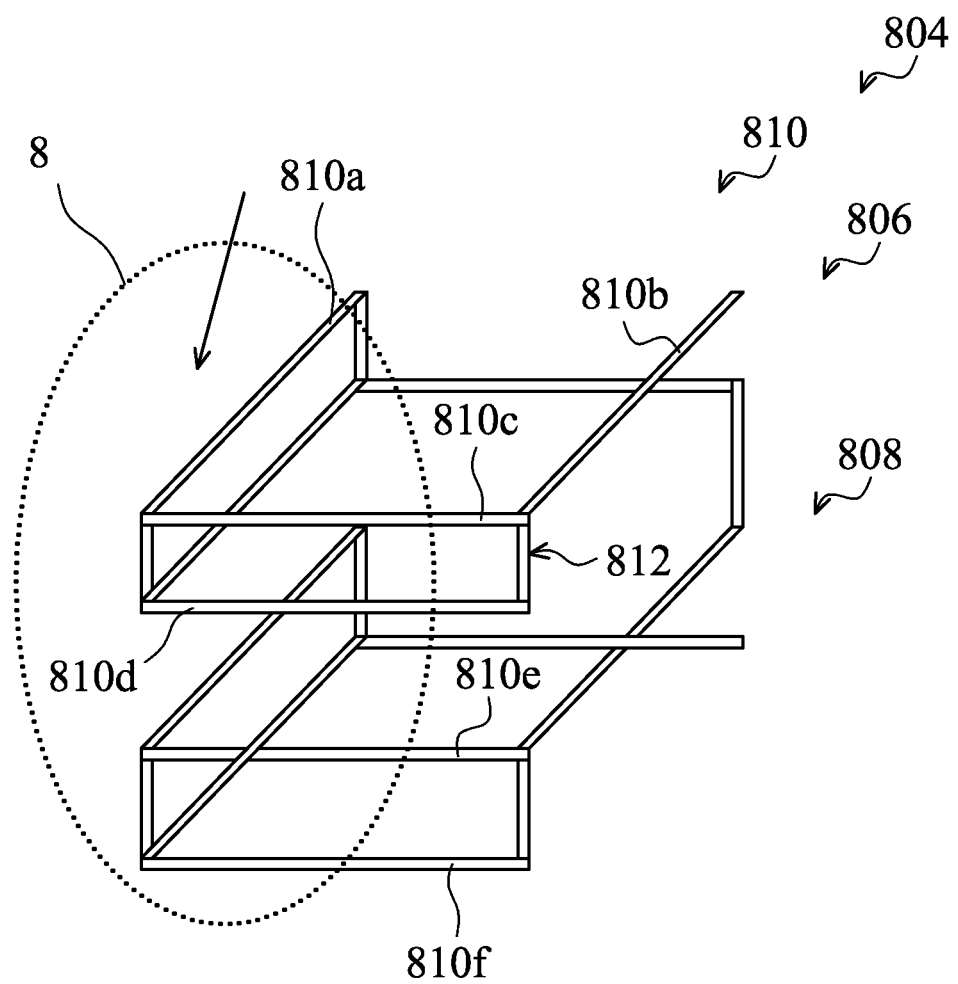
FIG. 7 is a partially exploded view of another alternative inductor assembly that is used with the semiconductor module shown in FIG. 1.

FIG. 7 illustrates an embodiment of an inductor assembly 804 that can be used with semiconductor module 100 (shown in FIG. 1) in place of inductor assembly 104 (shown in FIGS. 1 and 2). In some embodiments, inductor assembly 804 includes one helical inductive component 806 that includes portions formed of conductive line layers, such as metal layers 808, that are stacked on top of each other. More specifically, each metal layer 808 includes two metal lines 810, such as lines 810a and 810b, that are parallel with respect to each other.

Inductive component 806 includes a plurality of vias 812 that are configured to couple metal layers 808. In some embodiments, vias 812 are coupled to metal lines 810 such that two or metal lines on at least two different metal layers 808 are shunted together, as shown in area 8. For example, line 810c can be shunted with line 810d. Similarly, line 810e can be shunted with line 810f.

When the current flow moves from, for example, port 107 (shown in FIG. 1) to port 109 (shown in FIG. 1), the current flow moves through metal layers 808. As the current flow moves through metal layers 808, the positioning of the vias 812 with respect to the metal layers 808 that cause the metal layers to be shunted facilitates the current to be redirected from one metal layer 808 to a different metal layer 808. For example, the current can be redirected from the top metal layer 808 to the adjacent shunted layer 808. When the current flow is redirected from one metal layer 808 to a different metal layer 808, the capacitance and resistance of inductor assembly 804 can substantially decrease without having to space the metal layers 808 further apart from each other, as explained in more detail below with respect to FIG. 8A. Such a decrease results in a relatively high resonance frequency which can cause a substantially high quality factor (Q factor) of inductor assembly 804 while also saving chip space, as explained in more detail below with respect to FIG. 8B.

Figure 8A:
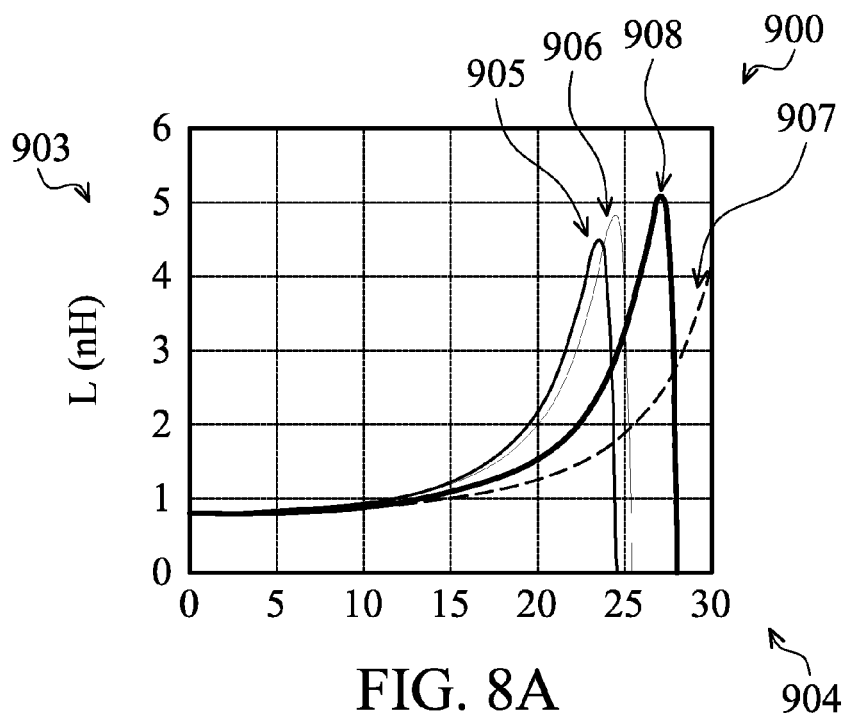
FIGS. 8A and 8B include graphical representations of energy measurements of the semiconductor module shown in FIG. 1.
Figure 8B:
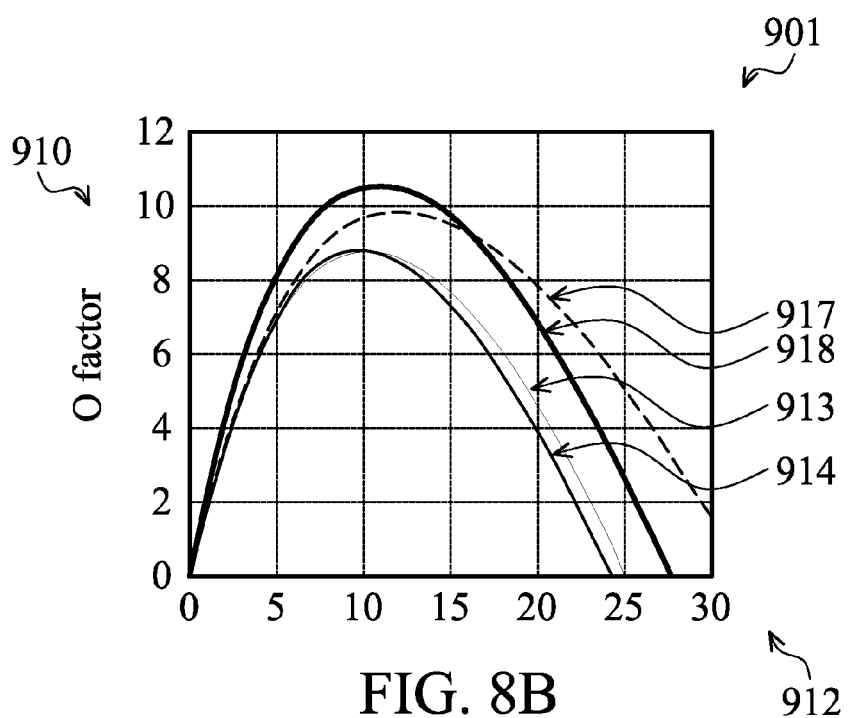

FIGS. 8A and 8B include graphical representations 900 and 901, respectively, of energy measurements of semiconductor module 100 (shown in FIG. 1). More specifically, graphical representation 900 includes a measurement of inductance 903 in L(nH) over a frequency range 904 from 0 to 30 GHz. Curves 905 and 906 represent the inductance measurement 903 over the frequency range 904 for conventional helical inductor design for no skipping layers with known metal layers for known inductors and using different metal layers. Curve 907 is representative of the inductance measurement 903 over the frequency range 904 for inductor assembly 104 (shown in FIGS. 1 and 2), wherein the spacing between adjacent parallel metal lines is at least two times the distance between two adjacent conductive line layers (as shown in FIGS. 1 and 2) or skip at least one metal layer. Curve 908 is representative of the inductance measurement 903 over the frequency range 904 for inductor assembly 804 (shown in FIG. 7), wherein two sets of metal layers 808 (shown in FIG. 7) are shunted together using vias 812. Based on the results shown in graphical representation 900, inductance measurement 903 for inductor assemblies 104 and 804 are substantially higher than known inductors. As such, capacitance and resistance are substantially lower for inductor assemblies 104 and 804 when compared with the known inductors.

Graphical representation 901 includes a measurement of a Q factor 910 over the frequency range 912. Curves 913 and 914 represent the Q factor 910 over time 912 for known metal layers for other inductors, without skipping metal layers.

Curve 917 is representative of the Q factor 910 over the frequency range 912 for inductor assembly 104. Curve 918 is representative of the Q factor 910 over the frequency range 912 for inductor assembly 804. Based on the results shown in graphical representation 901, the Q factor 910 for inductor assemblies 104 and 804 are substantially higher when compared with other inductors.

As compared to other inductors, the embodiments of the exemplary inductor assembly and methods described herein include at least one helical inductive component that is configured to facilitate tuning capacitance and resistance therein, while also saving chip area. More specifically, the inductor assembly includes a plurality of metal layers and a plurality of vias that are configured to couple to the metal layers to direct a current flow therein.

In some embodiments, an inductor assembly includes at least one helical inductive component comprising that includes a plurality of conductive line layers having conductive lines therein. A plurality of vias are configured to couple conductive lines from two or more conductive line layers such that a spacing between two adjacent parallel conductive lines, in different conductive line layers from each other, is two or more times a distance between respective bottom surfaces of two adjacent conductive line layers.

In some embodiments, a method includes providing at least one helical inductive component that includes a plurality of conductive line layers having conductive lines therein. A plurality of vias are coupled to the conductive lines from two or more of the conductive line layers such that a spacing between two adjacent parallel conductive lines, in different conductive line layers from each other, is two or more times a distance between respective bottom surfaces of two adjacent conductive line layers.

In some embodiments, an inductor assembly includes at least one helical inductive component that includes a plurality of metal layers having one or more metal lines therein. A plurality of vias are coupled to the metal lines such that two or more metal lines on at least two different ones of the metal layers are shunted.

Although the assembly and method described herein have been described in terms of exemplary embodiments, they are not limited thereto. Rather, the appended claims should be construed broadly, to include other variants and embodiments of the disclosed assembly and method, which can be made by those skilled in the art without departing from the scope and range of equivalents of the assemblies and methods.

What is claimed is:

1. An inductor assembly comprising:
   at least one helical inductive component comprising:
   a plurality of conductive line layers having conductive lines, wherein each of the plurality of conductive line layers comprises a pair of conductive lines parallel to each other and perpendicular to a pair of conductive lines in a next adjacent conductive line layer; and
   a plurality of vias configured to couple said conductive lines of adjacent layers from two or more of said plurality of conductive line layers such that a smallest spacing between two adjacent parallel conductive lines aligned one above the other, in different conductive line layers from each other, is two or more times a distance between respective bottom surfaces of two adjacent conductive line layers of said plurality of conductive line layers;
   wherein said at least one helical inductive component comprises a first helical inductive component and a second helical inductive component, at least a portion of said first helical inductive component is disposed onto a first integrated chip (IC) die and at least a portion of said second helical inductive component is disposed onto a second IC die that is vertically stacked onto the first IC die.

2. The inductor assembly of claim 1, wherein said at least one helical inductive component comprises a first helical inductive component being arranged according to a first layout and said second helical inductive component being arranged according to a second layout.

3. The assembly of claim 2, wherein said first helical inductive component substantially surrounds said second helical inductive component.

4. The inductor assembly of claim 2, further comprising a center tap between said first helical inductive component and said second helical inductive component for applying a bias voltage.

5. The inductor assembly of claim 2, each of said first and second helical inductive components comprises at least one of said plurality of conductive lines and said plurality of vias.

6. The inductor assembly of claim 5, wherein said plurality of vias are configured to couple to said plurality of conductive lines within each of said first helical inductive component and said second helical inductive component such that the first layout is rotated with respect to the second layout.

7. The inductor assembly of claim 5, wherein said plurality of vias are configured to couple to said plurality of conductive lines within each of said first helical inductive component and said second helical inductive component such that the first layout is identical with respect to the second layout.

8. The inductor assembly of claim 1, further comprising a conductive connecting element positioned between the first IC die and the second IC die.

9. A method of fabricating an inductor assembly, said method comprising:
   providing at least one helical inductive component that includes a plurality of conductive line layers having conductive lines wherein each layer of the plurality of conductive line layers comprises a pair of conductive lines parallel to each other and perpendicular to a pair of conductive lines in a next adjacent conductive line layer; and
   coupling a plurality of vias to the conductive lines from two or more of the plurality of conductive line layers such that a smallest spacing between two adjacent parallel conductive lines aligned one above the other, in different conductive line layers from each other, is two or more times a distance between respective bottom surfaces of two adjacent conductive line layers of the plurality of conductive line layers;
   wherein providing the at least one helical inductive component comprises:
   providing a first helical inductive comment that is at least partially disposed onto a first integrated chip (IC) die;
   providing a second helical inductive component that is at least partially disposed onto a second IC die, wherein the second IC die is vertically stacked onto the first IC die.

10. The method of claim 9, wherein providing at least one helical inductive component comprises:
    providing said first helical inductive component being arranged according to a first layout; and
    providing said second helical inductive component being arranged according to a second layout.

11. The method of claim 10, further comprising arranging the first helical inductive component such that the first helical inductive component substantially surrounds the second helical inductive component.

12. The method of claim 10, further comprising positioning a center tap between the first helical inductive component and the second helical inductive component for applying a bias voltage.

13. The method of claim 10, wherein each of the first and second helical inductive components includes at least one of the plurality of conductive lines and the plurality of vias.

14. The method of claim 13, further comprising coupling the plurality of vias to the plurality of conductive lines within each of the first helical inductive component and the second helical inductive component such that the first layout is rotated with respect to the second layout.

15. The method of claim 13, further comprising coupling the plurality of vias to the plurality of conductive lines within each of the first helical inductive component and the second helical inductive component such that the first layout is identical with respect to the second layout.

16. The method of claim 9, further comprising positioning a conductive connecting element the first IC die and the second IC die.

17. A method for making inductor assembly, comprising:
   providing at least one helical inductive component comprising:
   providing a plurality of conductive line layers having conductive lines, wherein each of the plurality of conductive line layers comprises a conductive line perpendicular to a conductive line in a next adjacent conductive line layer; and
   providing a plurality of vias configured to couple said conductive lines of adjacent layers from two or more of said plurality of conductive line layers such that a smallest spacing between two adjacent parallel conductive lines aligned one above the other, in different conductive line layers from each other, is two or more times a distance between respective bottom surfaces of two adjacent conductive line layers of said plurality of conductive line layers:
   wherein providing at least one helical inductive component comprises:
   providing a first helical inductive component that is at least partially disposed onto a first integrated chip (IC) die; and
   providing a second helical inductive component that is at least partially disposed onto a second IC die, wherein the second IC die is vertically stacked onto the first IC die.

18. The method of claim 17, wherein said providing at least one helical inductive component comprises providing a first helical inductive component according to a first layout and providing a second helical inductive component according to a second layout.

19. The method of claim 17, wherein said providing at least one helical inductive component comprises surrounding said second helical inductive component with said first helical inductive component.

20. The method of claim 17, wherein said providing at least one helical inductive component comprises providing a center tap between said first helical inductive component and said second helical inductive component for applying a bias voltage.

* * * * *